(12) United States Patent
Bryant et al.

(10) Patent No.: US 11,621,802 B2
(45) Date of Patent: Apr. 4, 2023

(54) TURBO DECODER WITH REDUCED PROCESSING AND MINIMAL RE-TRANSMISSION

(71) Applicant: John Mezzalingua Associates, LLC, Liverpool, NY (US)

(72) Inventors: Rodney Bryant, Richmond, VA (US); Stephen Turner, Mechanicsville, VA (US); Jeffrey Masters, Ashland, VA (US)

(73) Assignee: John Mezzalingua Associates, LLC, Liverpool, NY (US)

( * ) Notice: Subject to any disclaimer, the term of this patent is extended or adjusted under 35 U.S.C. 154(b) by 0 days.

(21) Appl. No.: 17/290,434

(22) PCT Filed: Jun. 13, 2019

(86) PCT No.: PCT/US2019/037116
§ 371 (c)(1),
(2) Date: Apr. 30, 2021

(87) PCT Pub. No.: WO2020/072106
PCT Pub. Date: Apr. 9, 2020

(65) Prior Publication Data
US 2022/0038209 A1 Feb. 3, 2022

Related U.S. Application Data

(60) Provisional application No. 62/739,442, filed on Oct. 1, 2018.

(51) Int. Cl.
*H04L 1/08* (2006.01)
*H04L 1/00* (2006.01)
*H04L 1/1812* (2023.01)

(52) U.S. Cl.
CPC .............. *H04L 1/08* (2013.01); *H04L 1/0061* (2013.01); *H04L 1/1812* (2013.01)

(58) Field of Classification Search
CPC ....... H04L 1/08; H04L 1/0061; H04L 1/1806; H04L 1/1845
See application file for complete search history.

(56) References Cited

U.S. PATENT DOCUMENTS

| 2002/0159545 A1* | 10/2002 | Ramesh .............. H04L 27/0008 375/340 |
| 2009/0313516 A1* | 12/2009 | Shin ...................... H04L 1/1806 714/748 |
| 2013/0121323 A1* | 5/2013 | Lilleberg .............. H04L 1/1845 370/338 |

OTHER PUBLICATIONS

Shafique et al., Analysis and throughput optimization of selective chase combining for OFDM systems, ArXiv (retrieved from google), pp. 1 to 30 (Year: 2018).*

(Continued)

*Primary Examiner* — Shelly A Chase
(74) *Attorney, Agent, or Firm* — Ashek M. Rahman (57) ABSTRACT

Disclosed is a method for processing code blocks as implemented by a baseband processor. The method involves performing a cyclic redundancy check on decoded and deinterleaved code blocks until one fails its CRC check. On first failure the baseband processor requests a retransmission of the code blocks and resumes CRC checks on the retransmitted code blocks, beginning at the code block that had failed. In the event of subsequent failures, the baseband processor performs a soft combine on the failed retransmitted block with its original transmitted counterpart. Only if the soft combined code block fails does the baseband processor request another retransmission. In this case, subsequent CRC failures result in soft combines of three corresponding code words, making the process more robust. The method reduces the number of retransmissions as well (Continued)

as the computing resources needed for processing incoming code blocks.

22 Claims, 4 Drawing Sheets

(56) References Cited

OTHER PUBLICATIONS

Chiti et al., A soft combining hybrid-ARQ technique applied to throughput maximization within 3G satellite IP networks, IEEE Trans. on Vehicular technology, vol. 56, No. 2, pp. 594-604. (Year: 2007).*

* cited by examiner

TURBO DECODER WITH REDUCED PROCESSING AND MINIMAL RE-TRANSMISSION

CROSS-REFERENCE

This application is a national phase application of Patent Cooperation Treaty Application No. PCT/US2019/037116 filed Jun. 13, 2019, which claims the benefit of U.S. Provisional Application No. 62/739,442, filed Oct. 1, 2018, entitled "TURBO DECODER WITH REDUCED PROCESSING AND MINIMAL RE-TRANSMISSION," the entirety of which are incorporated herein by reference.

BACKGROUND OF THE INVENTION

Field of the Invention

The present invention relates to wireless communications, and more particularly, physical layer (PHY) processing of uplink data.

Related Art

LTE uplink (UL) data processing includes a Hybrid Automatic Repeat Request (HARQ) turbo decoder step within the physical (PHY) layer of the protocol stack. In this turbo decoding step, in-phase and quadrature (I/Q) data is demodulated and then de-interleaved into a plurality of code blocks. Each code block has a size that is proportionate to the modulation scheme and code rate. Further, each code block has appended to it cyclical redundancy check (CRC) data corresponding to that code block.

In an example, 1000 bytes of data may be transmitted by the UE to the eNodeB in 4 blocks of data. Each of the 4 blocks has a set of CRC data appended to it, along with a set of "master" CRC data corresponding to a CRC of the entire set of 1000 bytes.

Under conventional turbo decoding, a baseband processor within the eNodeB performs a CRC check on the entire set of 1000 bytes of data using the "master" CRC data. If the CRC check fails, the eNodeB transmits a request to the UE to re-transmit the 1000 bytes of data and the process repeats. Other conventional approaches include performing a CRC check on all of the individual code blocks, unconditionally. Only after all of the CRC checks have been done is the presence of a failure assessed. If any of the code block CRC checks had failed, the data is retransmitted by the UE.

The conventional approaches are inefficient in that time and air interface resources are consumed by the repeated transmissions of the same set of data. Further, the latter conventional approach is inefficient in that the CRC check is done on all of the code blocks regardless of whether or how many have failed.

Accordingly, there is a need for a UL turbo decoding scheme that reduces the number of re-transmissions of data from the UE while reducing the computational load on the baseband processor of the eNodeB.

SUMMARY

An aspect of the present invention involves a method for processing digital data received from a wireless transmission. The method comprises performing a cyclic redundancy check procedure of each of a transmitted first plurality of code blocks until a first cyclic redundancy failure; performing the cyclic redundancy check procedure on each of a subset of a first retransmitted plurality of code blocks beginning with a retransmitted code block corresponding to the first cyclic redundancy failure until a second cyclic redundancy failure; and performing a soft combine procedure on the retransmitted code block corresponding to the second cyclic redundancy check failure and a corresponding second failure code block within the first plurality of code blocks to form a second failure combined code block. The method further comprises performing the cyclic redundancy check procedure on each of a subset of a second retransmitted plurality of code blocks beginning with a retransmitted code block corresponding to the second cyclic redundancy check failure until a third cyclic redundancy check failure; and performing the soft combine procedure on the retransmitted code block corresponding to the third cyclic redundancy check failure and a corresponding code block from the first plurality of code blocks and a corresponding code block from the first retransmitted plurality of code blocks to form a third failure combined code block. The method further comprises performing the cyclic redundancy check procedure on each of a subset of a third retransmitted plurality of code blocks beginning with a retransmitted code block corresponding to the third cyclic redundancy check failure until a fourth cyclic redundancy check failure; and performing the soft combine procedure on the retransmitted code block corresponding to the fourth cyclic redundancy check failure and a corresponding code block from the first plurality of code blocks and corresponding code blocks from prior retransmitted plurality of code blocks to form a fourth failure combined code block.

Another aspect of the present invention involves a method comprising receiving a first plurality of code blocks; performing a cyclic redundancy check procedure of each of the first plurality of code blocks until a first cyclic redundancy failure; requesting a first retransmission of the first plurality of code blocks; receiving a first retransmitted plurality of code blocks; performing the cyclic redundancy check procedure on each of a subset of the first retransmitted plurality of code blocks beginning with a retransmitted code block corresponding to the first cyclic redundancy failure until a second cyclic redundancy failure; and performing a soft combine procedure on the retransmitted code block corresponding to the second cyclic redundancy check failure and a corresponding second failure code block within the first plurality of code blocks to form a second failure combined code block. The method further includes requesting a second retransmission of the plurality of code blocks; receiving a second retransmitted plurality of code blocks; performing the cyclic redundancy check procedure on each of a subset of the second retransmitted plurality of code blocks beginning with a retransmitted code block corresponding to the second cyclic redundancy check failure until a third cyclic redundancy check failure; and performing the soft combine procedure on the retransmitted code block corresponding to the third cyclic redundancy check failure and a corresponding code block from the first plurality of code blocks and a corresponding code block from the first retransmitted plurality of code blocks to form a third failure combined code block. The method further includes requesting a third retransmission of the plurality of code blocks; receiving a third retransmitted plurality of code blocks; performing the cyclic redundancy check procedure on each of a subset of the third retransmitted plurality of code blocks beginning with a retransmitted code block corresponding to the third cyclic redundancy check failure until a fourth cyclic redundancy check failure; and performing the soft combine procedure on the retransmitted code block corresponding to the fourth cyclic redundancy check failure and a corresponding code block from the first plurality of code blocks and corresponding code blocks from prior retransmitted plurality of code blocks to form a fourth failure combined code block.

Another aspect of the present invention involves a non-transitory computer-readable medium having program code to process digital data received from a wireless transmission. The program code includes program code to perform a cyclic redundancy check procedure of each of a transmitted first plurality of code blocks until a first cyclic redundancy failure; program code to perform the cyclic redundancy check procedure on each of a subset of a first retransmitted plurality of code blocks beginning with a retransmitted code block corresponding to the first cyclic redundancy failure until a second cyclic redundancy failure; and program code to perform a soft combine procedure on the retransmitted code block corresponding to the second cyclic redundancy check failure and a corresponding second failure code block within the first plurality of code blocks to form a second failure combined code block. The program code further includes program code to perform the cyclic redundancy check procedure on each of a subset of a second retransmitted plurality of code blocks beginning with a retransmitted code block corresponding to the second cyclic redundancy check failure until a third cyclic redundancy check failure; and program code to perform the soft combine procedure on the retransmitted code block corresponding to the third cyclic redundancy check failure and a corresponding code block from the first plurality of code blocks and a corresponding code block from the first retransmitted plurality of code blocks to form a third failure combined code block. The program code also includes program code to perform the cyclic redundancy check procedure on each of a subset of a third retransmitted plurality of code blocks beginning with a retransmitted code block corresponding to the third cyclic redundancy check failure until a fourth cyclic redundancy check failure; and program code to perform the soft combine procedure on the retransmitted code block corresponding to the fourth cyclic redundancy check failure and a corresponding code block from the first plurality of code blocks and corresponding code blocks from prior retransmitted plurality of code blocks to form a fourth failure combined code block.

Yet another aspect of the present invention involves a non-transitory computer-readable medium having program code to receive a first plurality of code blocks; program code to perform a cyclic redundancy check procedure of each of the first plurality of code blocks until a first cyclic redundancy failure; program code to request a first retransmission of the first plurality of code blocks; program code to receive a first retransmitted plurality of code blocks; program code to perform the cyclic redundancy check procedure on each of a subset of the first retransmitted plurality of code blocks beginning with a retransmitted code block corresponding to the first cyclic redundancy failure until a second cyclic redundancy failure; and program code to perform a soft combine procedure on the retransmitted code block corresponding to the second cyclic redundancy check failure and a corresponding second failure code block within the first plurality of code blocks to form a second failure combined code block. The program code further includes program code to request a second retransmission of the plurality of code blocks; program code to receive a second retransmitted plurality of code blocks; program code to perform the cyclic redundancy check procedure on each of a subset of the second retransmitted plurality of code blocks beginning with a retransmitted code block corresponding to the second cyclic redundancy check failure until a third cyclic redundancy check failure; and program code to perform the soft combine procedure on the retransmitted code block corresponding to the third cyclic redundancy check failure and a corresponding code block from the first plurality of code blocks and a corresponding code block from the first retransmitted plurality of code blocks to form a third failure combined code block. The program code further includes program code to request a third retransmission of the plurality of code blocks; program code to receive a third retransmitted plurality of code blocks; program code to perform the cyclic redundancy check procedure on each of a subset of the third retransmitted plurality of code blocks beginning with a retransmitted code block corresponding to the third cyclic redundancy check failure until a fourth cyclic redundancy check failure; and program code to perform the soft combine procedure on the retransmitted code block corresponding to the fourth cyclic redundancy check failure and a corresponding code block from the first plurality of code blocks and corresponding code blocks from prior retransmitted plurality of code blocks to form a fourth failure combined code block.

DESCRIPTION OF EXEMPLARY EMBODIMENTS

Figure 1:
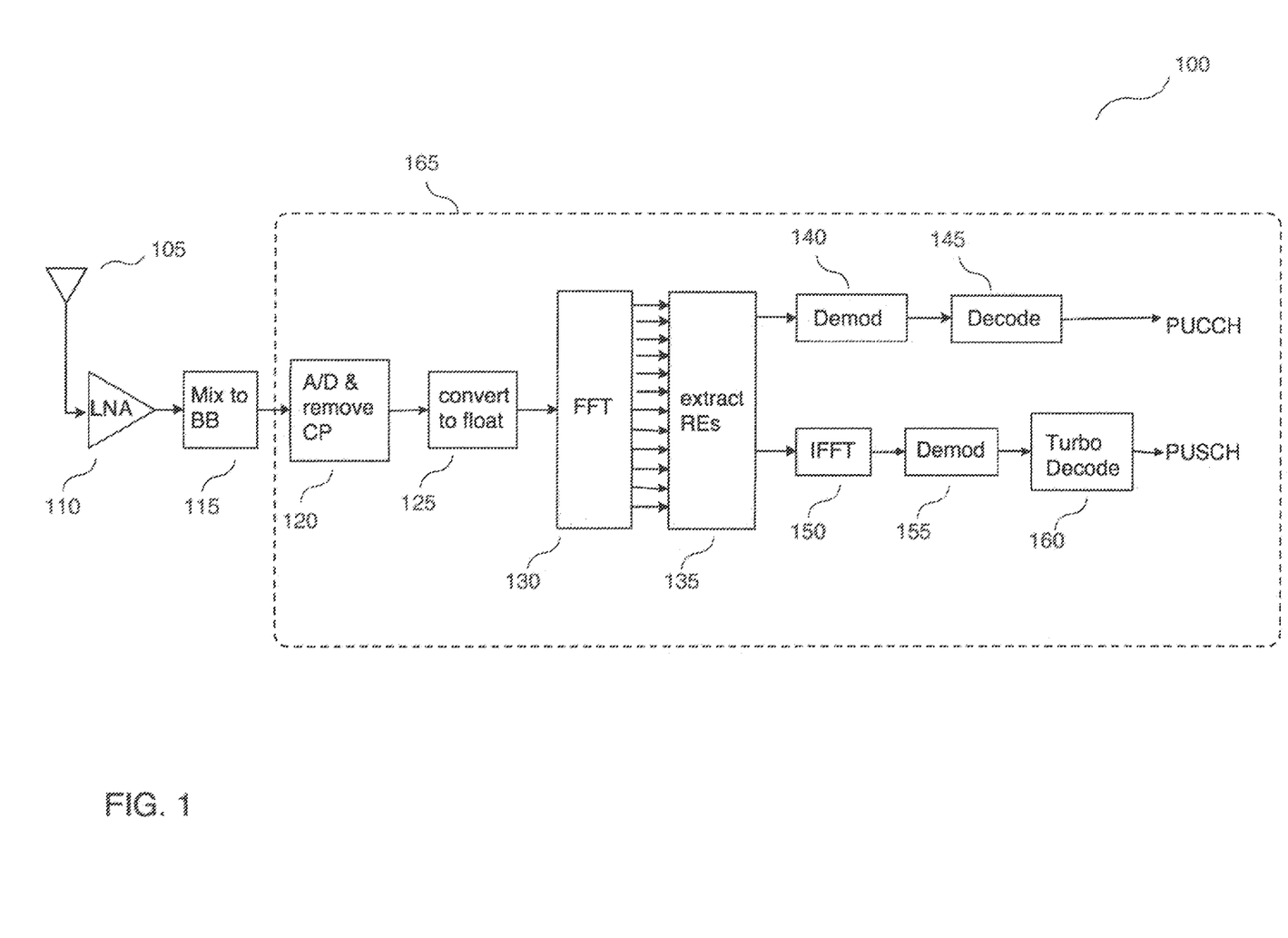
FIG. 1 illustrates an exemplary LTE uplink PHY layer processing chain according to the disclosure.

FIG. 1 illustrates an exemplary LTE uplink PHY layer processing chain 100 according to the disclosure. Blocks 120-160 processing chain 100 may fall within the functionality of a baseband processor 165. Baseband processor 165 may be implemented in software as a pure virtual baseband processor, or it may be implemented by a combination of software executed on one more processors and special purpose hardware. As will be evident in the disclosure, there is an advantage to having the baseband processor 165 implemented as a pure software virtual baseband processor.

Referring to elements 105-120, signals received by antenna 105 are amplified by low noise amplifier 110 and the detected signal is converted from an analog signal to a digital signal by A/D converter 120, at which point the baseband processor 165 removes the Cyclic Prefix from the digitized signal. These steps may be performed in accordance with conventional LTE PHY layer processing described in 3GPP technical specifications TS 26.212 and TS 36.213. The output of block 120 is a series of digitized symbols, each of which may have 2048 samples. The 2048 samples contain 16 bit integer I/Q (in-phase and quadrature) data representing the time domain baseband signal received by antenna 105.

In block 125, the baseband processor 165 converts the 16 bit integer I/Q data into 32 bit floating point representation. Doing so greatly increases the dynamic range of further processing in processing chain 100. Further, an advantage of a pure software virtual baseband processor is that conversion to floating point representation and subsequent processing is enabled by floating point calculation engines present in server processor hardware. This may enable higher precision high speed processing that may be dynamically provisioned among servers in a cloud computing environment.

In blocks 130 and 135, the baseband processor 165 executes instructions to perform an FFT (Fast Fourier Transform) sequentially on each of the 2048 digital sample blocks corresponding to the symbols received in blocks 110-120. The result of block 130 is a set of corresponding 2048 frequency domain samples, each sample represented in 32 bit floating point I/Q values. As each subsequent set of 2048 time domain samples (of a given symbol) is sequentially processed, FFT block 130 reconstructs a radio frame composed of Resource Elements (REs).

In block 135, the baseband processor 165 executes instructions to extract the relevant Resource Elements corresponding to various physical channels to be used by the baseband processor in higher layer processing of the protocol stack. Among these REs are those corresponding the PUCCH (Physical Uplink Control Channel) and the PUSCH (Physical Uplink Shared Channel). Blocks 140 and 145 pertain to the processing of the PUCCH, which may be done according to the standard specification and need not be described here. However, the processing of the PUSCH contains additional steps according to the process of the disclosure.

In block 150, the baseband processor 165 executes instructions to assemble the REs corresponding to the PUSCH and perform an IFFT (Inverse FFT) on the assembled REs corresponding to each UE's user data, including DCCH (Dedicated Control Channel), CCCH (Common Control Channel), and DTCH (Dedicated Traffic Channel) data. The result of block 150 is a stream of code words of encoded time domain 32 bit floating point I/Q data values corresponding to the PUSCH data transmitted by each UE connected to the baseband processor.

In block 155, the baseband processor 165 executes instructions to demodulate the 32 bit floating point I/Q data generated in block 150. Modulation may be implemented using conventional procedures. However, the use of 32 bit floating point data may provide for a much more precise (and thus robust) demodulation solution. This is particularly true for higher order modulation schemes (e.g., 16-QAM, 64-QAM, and 256-QAM), whereby the improved dynamic range and precision of 32 bit floating point arithmetic (vs. 16 bit integer) potentially reduces the error rate at these modulation schemes. The result of block 155 is code word having a set of "master" CRC bits.

In block 160, baseband processor 165 executes instructions to perform turbo decoding according to the disclosure. This includes de-interleaving and de-scrambling the demodulated codeword to form a set of code blocks. Each subsequent code block corresponds to a given UE's transmitted PUSCH data, along with a 26-bit block of CRC data corresponding to the given code block. The length of the code block in bytes is a function of the modulation scheme employed by the given UE at the time of transmission, along with a code rate. Specifics for performing these steps may be found in 3GPP TS 36.212.

Figure 2:
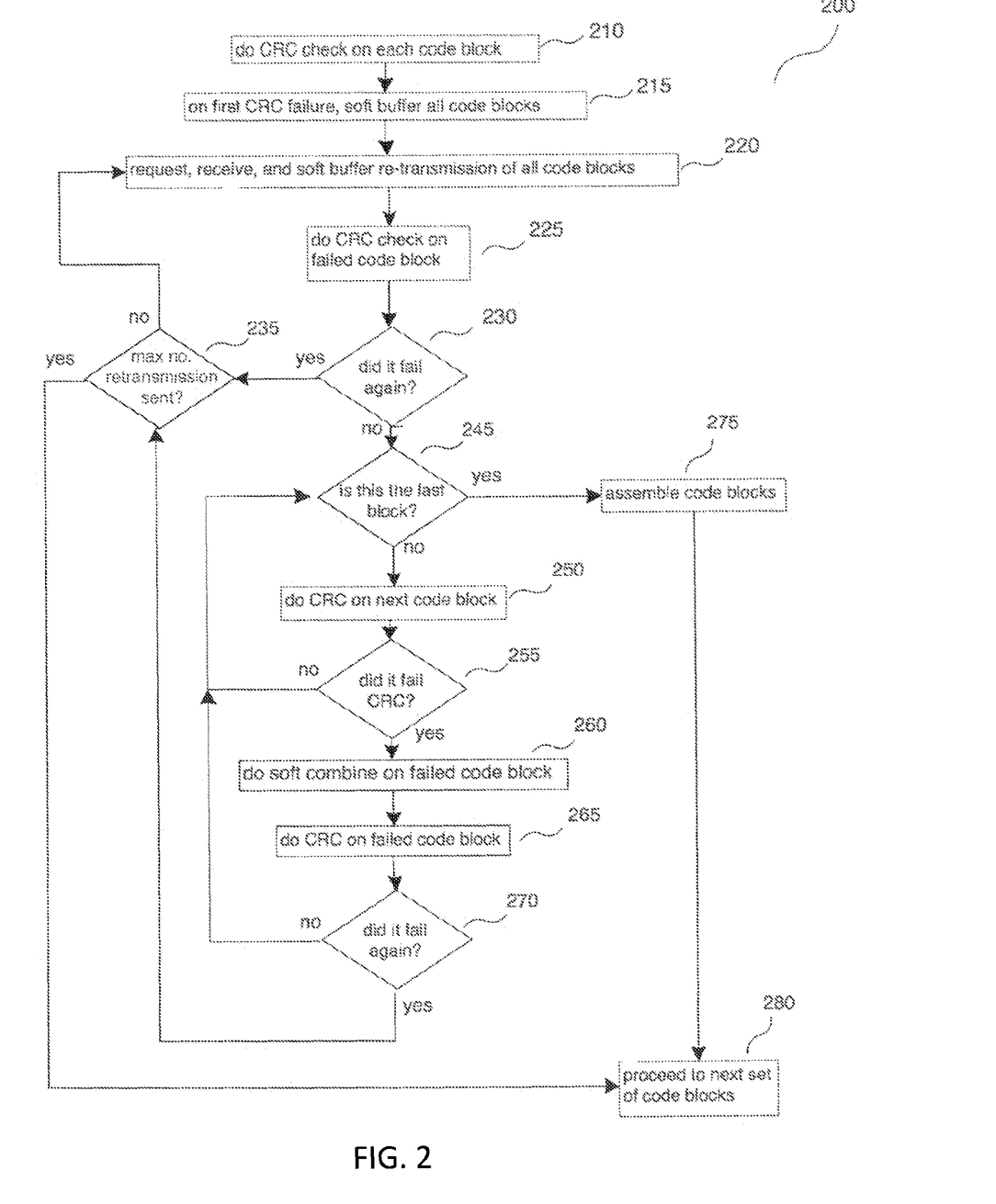
FIG. 2 illustrates an exemplary process for performing turbo decoding using minimal computational resources and re-transmissions according to the disclosure.

FIG. 2 illustrates an exemplary process 200 for minimizing computation and re-transmission according to the disclosure, which baseband processor 165 may execute instructions to perform as part of block 160. In the following description the steps described in process 200 may be performed by the baseband processor 165 executing machine-readable instructions on one or more processor cores or virtual machines.

In step 210, baseband processor 165 performs a CRC check on each code block that collectively constitute the codeword input to block 160, until one fails. If none of the CRC checks fail, then process 200 ends and the baseband processor 200 proceeds to the next set of code blocks. Otherwise, on first CRC failure baseband processor 165 proceeds to step 215 and soft buffers all of the code blocks, including those that have not yet undergone CRC check.

In step 220, baseband processor 165 requests a retransmission from the UE in accordance with conventional HARQ procedures. And on receiving the retransmitted data (in this case, a new set of code blocks representing the same data re-transmitted by the UE), the baseband processor 165 soft buffers the re-transmitted code blocks.

In step 225, baseband processor 165 executes instructions to perform a CRC check on the retransmitted code block corresponding to the one that failed the initial CRC check. This may be done according to a conventional CRC check implementation. If the retransmitted code block (corresponding to the one that had initially failed) fails again, process 200 proceeds to step 235, in which baseband processor 165 determines if the number of retransmissions is at a predetermined maximum value. If it not yet at the maximum value, process 200 may return to step 220. If the number of retransmissions is already at the maximum value, then process 200 may proceed to step 280, in which case baseband processor 165 abandons the current set of code blocks and proceeds to the next set of code blocks.

Variations to step 235 are possible and within the scope of the disclosure. For example, the predetermined maximum number of retransmissions may pertain to retransmission for a single code block, or it may pertain to the total number of retransmissions for the set of code blocks of the given code word.

Returning to step 230, if the retransmitted code block (corresponding to the one that had initially failed) passes the CRC check, then process 200 proceeds via step 230 to step 245, in which baseband processor determines whether the previously failed code block is the last code block in the set. If it is the last code block, the process 240 proceeds to step 265, in which baseband processor 165 assembles the successful CRC checked code blocks as the UE data to be processed further. Note that this may include code blocks from the original transmission that passed the CRC check the first time as well as the retransmitted code block that passed after its corresponding original code block had failed. Process 200 further proceeds to process the next set of code blocks corresponding to the next set of UE data, via step 270. If, however the current code block is not the last code block in the set, then process 200 proceeds to step 250.

In step 250, baseband processor 165 executes instructions to perform a CRC check on the next retransmitted code block, using the retransmitted code block's CRC data. The specific implementation of CRC check may be the same as that done in step 225, which may be a conventional implementation. If the current code block passes the CRC check, then process 200 proceeds via step 255 to repeat steps 245 and (potentially) step 250, depending on whether the current code block (the one that just passed the CRC check in step 250) is the last code block of the set. Note that at this stage in process 200 (from steps 225 ownward) the baseband processor 165 is performing CRC checks on the retransmitted code blocks. All of the originally-transmitted code blocks beyond the one that initially failed have not been examined.

Returning to step 255, if the retransmitted code block fails the CRC check, then process 200 proceeds to step 260, in which baseband processor 165 performs a soft combine on the current retransmitted code block with its corresponding originally-transmitted code block, on the data only, and not the respective CRC data with each code block. The soft combine implementation may involve employing a conventional soft combining procedure used in conjunction with HARQ processes.

In step 265, baseband processor 165 executes instructions to perform a CRC check on the soft-combined code block, using the CRC bits of the most recently transmitted code block to perform the check. If the soft-combined code block passes the CRC check, then process 200 proceeds to step 245 in which the baseband processor 165 determines if the current code block is the last code block of the set, and if not, moving on to the next code block.

If, on the other hand, the CRC check failed again, then the soft combine failed to repair the code block. In this case process 200 proceeds to step 235, in which the baseband processor 165 executes instructions to determine how many times retransmission requests have been issued. If it is greater than a predetermined maximum value, then process 200 proceeds to step 280, in which the baseband processor 165 abandons this set of code blocks and moves on to process the next set of code blocks. If the number of retransmissions is not at maximum value, then process returns to step 220, in which baseband processor 165 requests for another retransmission from the UE, and process 200 repeats from step 220 with the latest retransmitted code blocks.

Figure 3:
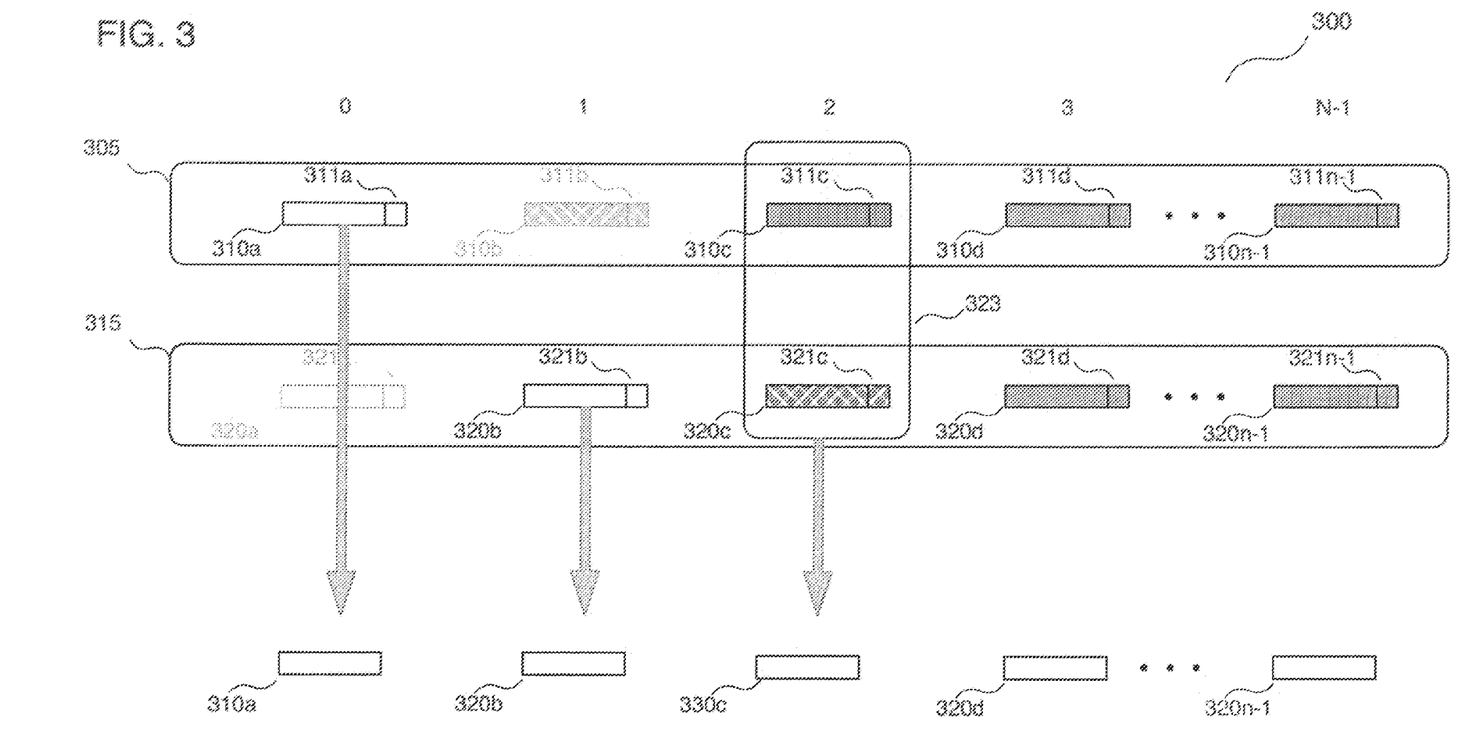
FIG. 3 illustrates an example scenario of execution of the process of FIG. 2, in which two CRC checks fail.

FIG. 3 illustrates an example scenario 300 depicting the function of process 200.

According to step 210, baseband processor 165 performs CRC checks on the originally code blocks $310_A$-$310_{N-1}$ received from the original transmission 305. The first code block $310_A$ passes the CRC check but the second block $310_B$ fails. According to step 220, baseband processor 165 requests retransmission of the code blocks, which it receives and buffers as code blocks $320_A$-$320_{N-1}$ as retransmission 315.

According to step 225, baseband processor 165 then performs a CRC check on code block $320_B$, corresponding to code block $310_B$, which previously failed. In this scenario, code block $320_B$ passes the CRC check with its CRC data $321_B$ and process 200 proceeds to step 250, at which point code block $320_C$ fails its CRC check. Pursuant to steps 255-265, baseband processor 165 executes instructions to perform a soft combine on code blocks $320_C$ and $310_C$, and performs a CRC check on the resulting soft-combined code block $330_C$, which passes the CRC test using the most recently transmitted CRC data $321_C$. Although not illustrated, example scenario 300 proceeds in iterations of steps 245-270 until it processes the last code block, at which point it assembles code blocks $310_A$, soft combined code block $330_C$, and code blocks $320_D$-$320_{N-1}$ for further processing and restarts process 200 with the next set of code blocks.

Figure 4:
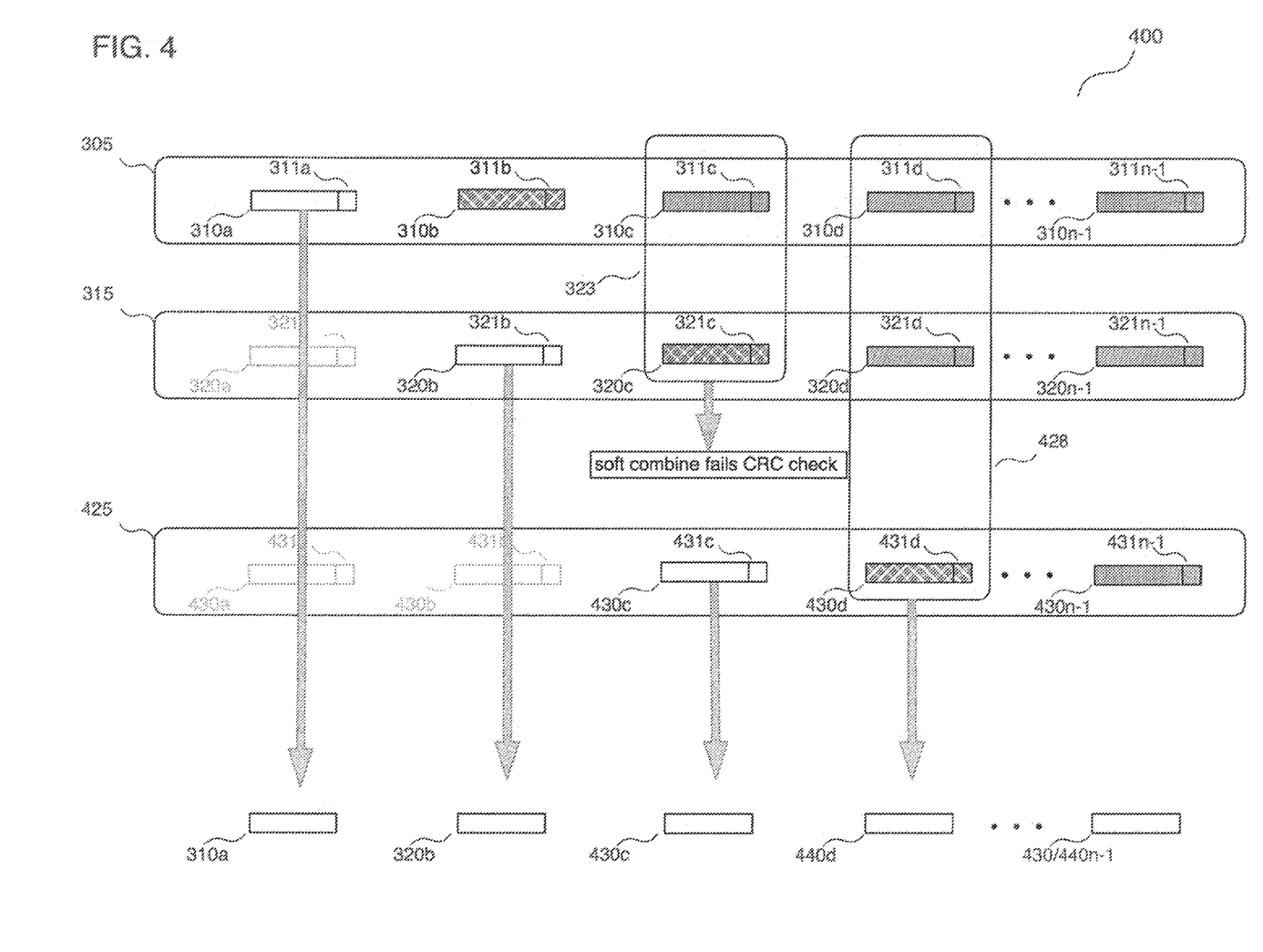
FIG. 4 illustrates an example scenario in which a CRC failure after a first re-transmission further fails a second CRC check.

FIG. 4 illustrates example scenario 400, further depicting the function of process 200.

Example scenario 400 begins similarly to scenario 300, in which the first code block $310_A$ of original transmission 305 passes its CRC check, but the second code block 310E doesn't. In further similarity, baseband processor 165 requests retransmission in step 220, performs a CRC check on the retransmitted code block $320_B$ corresponding to the failed code block $310_B$, and proceeds to step 250. In step 250, code block $321_C$ fails its CRC check, and baseband processor 165 performs a soft combine on the data portions of code blocks $320_C$ and $310_C$. However, unlike in scenario 300, the soft combined code block fails the CRC check performed in step 265.

Given the CRC failure in step 265, baseband processor 165 requests another retransmission 425 pursuant to step 220 via steps 270 and 235 (assume the current number of retransmission is less than the predetermined maximum). Baseband processor 165 performs CRC check on code block $430_C$, which passes, and then proceeds to step 250 to perform a CRC on code block $430_D$, which fails. According to steps 260-265, baseband processor 165 performs a soft combine on three code blocks, $430_D$, $320_D$, and $310_D$, and performs a CRC check on the resulting soft combined code block $440_D$ using the CRC data $431_D$. Under scenario 400, the three-way soft combined code block $440_D$ passes the CRC test, and process 200 proceeds to step 245. Further to scenario 400, all of the subsequent code blocks either pass their respective CRC checks, or if any fail, the subsequent corresponding three-way soft combined code block passes.

According to process 200 of the disclosure, with each additional retransmission of code blocks, any subsequent soft combine due to a CRC failure in step 250 is performed with an increasing number of code blocks as input. Accordingly, the soft combine done in step 260 yields an increasingly robust result, increasing the likelihood of the subsequent CRC check passing in step 165. The effect of this is that after a minimal number of retransmissions, the CRC checks on the subsequent code blocks become more robust so that further retransmissions may no longer be required. This reduces the number of unnecessary retransmissions from the UE.

Further to process 200, because the CRC check on a given transmission or retransmission stops at the first CRC failure, baseband processor 165 resources are not wasted by performing CRC checks on code blocks that may have to be done again on a subsequent retransmission. Accordingly, each code block of a given transmission or retransmission either passes its CRC check the first time it is performed, or it is input to a soft combine for processing a subsequent retransmission. This reduces the processing overhead.

Variations to process 200 are possible and within the scope of the disclosure. For example, step 220 could be modified so that the request for retransmission includes only requesting the code blocks starting from the code block that failed the CRC. For example, referring to scenario 400, the request for retransmission 315 may only include code blocks $320_B$-$320_{N-1}$, and the request for retransmission 425 may only include code blocks $430_C$-$430_{N-1}$. This would prevent the UE from having to retransmit all of the code blocks. One consideration for this feature is that the UE would have to support this feature and the baseband processor would have to have control channel resources to provide the specific instructions to the UE.

It will be understood that process 200 may be implemented by the baseband processor of a UE as well as by an eNodeB. Although the discussion above describes the process in the context of retransmission from a UE, the reverse (transmission from an eNodeB) would apply equally well.

Although the above disclosure refers to a cyclic redundancy check (CRC), it will be understood that the disclosure will also pertain to other forms of error detection and correction schemes on binary data, and that the use of the term CRC may be substituted with the name of any of these other procedures.

What is claimed is:

1. A method for processing digital data received from a wireless transmission, comprising:
performing a cyclic redundancy check procedure of each of a transmitted first plurality of code blocks until a first cyclic redundancy failure;
performing the cyclic redundancy check procedure on each of a subset of a first retransmitted plurality of code blocks beginning with a retransmitted code block corresponding to the first cyclic redundancy failure until a second cyclic redundancy failure; and
performing a soft combine procedure on the retransmitted code block corresponding to the second cyclic redundancy check failure and a corresponding second failure code block within the first plurality of code blocks to form a second failure combined code block.

2. The method of claim 1, wherein the first retransmitted plurality of code blocks is received in response to a request for a first retransmission at the occurrence of the first cyclic redundancy failure.

3. The method of claim 1, further comprising:
performing the cyclic redundancy check procedure on each of a subset of a second retransmitted plurality of code blocks beginning with a retransmitted code block corresponding to the second cyclic redundancy check failure until a third cyclic redundancy check failure; and
performing the soft combine procedure on the retransmitted code block corresponding to the third cyclic redundancy check failure and a corresponding code block from the first plurality of code blocks and a corresponding code block from the first retransmitted plurality of code blocks to form a third failure combined code block.

4. The method of claim 3, wherein the second retransmitted plurality of code blocks is received in response to a request for a second retransmission at the occurrence of the second cyclic redundancy failure.

5. The method of claim 3, further comprising:
performing the cyclic redundancy check procedure on each of a subset of a third retransmitted plurality of code blocks beginning with a retransmitted code block corresponding to the third cyclic redundancy check failure until a fourth cyclic redundancy check failure; and
performing the soft combine procedure on the retransmitted code block corresponding to the fourth cyclic redundancy check failure and a corresponding code block from the first plurality of code blocks and corresponding code blocks from prior retransmitted plurality of code blocks to form a fourth failure combined code block.

6. The method of claim 1, further comprising performing the cyclic redundancy check procedure on a first remainder of the first retransmitted plurality of code blocks, wherein the first remainder of the first retransmitted plurality of code blocks begins with the second failure combined code block.

7. The method of claim 1, wherein the cyclic redundancy check procedures are performed by a baseband processor within a radio base station.

8. The method of claim 1, wherein the plurality of code blocks is transmitted by a user equipment (UE).

9. A method for processing digital data received from a wireless transmission, comprising:
receiving a first plurality of code blocks;
performing a cyclic redundancy check procedure of each of the first plurality of code blocks until a first cyclic redundancy failure;
requesting a first retransmission of the first plurality of code blocks;
receiving a first retransmitted plurality of code blocks;
performing the cyclic redundancy check procedure on each of a subset of the first retransmitted plurality of code blocks beginning with a retransmitted code block corresponding to the first cyclic redundancy failure until a second cyclic redundancy failure; and
performing a soft combine procedure on the retransmitted code block corresponding to the second cyclic redundancy check failure and a corresponding second failure code block within the first plurality of code blocks to form a second failure combined code block.

10. The method of claim 9, further comprising:
requesting a second retransmission of the plurality of code blocks;
receiving a second retransmitted plurality of code blocks;
performing the cyclic redundancy check procedure on each of a subset of the second retransmitted plurality of code blocks beginning with a retransmitted code block corresponding to the second cyclic redundancy check failure until a third cyclic redundancy check failure; and
performing the soft combine procedure on the retransmitted code block corresponding to the third cyclic redundancy check failure and a corresponding code block from the first plurality of code blocks and a corresponding code block from the first retransmitted plurality of code blocks to form a third failure combined code block.

11. The method of claim 10, further comprising:
requesting a third retransmission of the plurality of code blocks;
receiving a third retransmitted plurality of code blocks;
performing the cyclic redundancy check procedure on each of a subset of the third retransmitted plurality of code blocks beginning with a retransmitted code block corresponding to the third cyclic redundancy check failure until a fourth cyclic redundancy check failure; and
performing the soft combine procedure on the retransmitted code block corresponding to the fourth cyclic redundancy check failure and a corresponding code block from the first plurality of code blocks and corresponding code blocks from prior retransmitted plurality of code blocks to form a fourth failure combined code block.

12. The method of claim 9, further comprising performing the cyclic redundancy check procedure on a first remainder of the first retransmitted plurality of code blocks, wherein the first remainder of the first retransmitted plurality of code blocks begins with the second failure combined code block.

13. A non-transitory computer-readable medium having program code recorded thereon, the program code comprising:
program code to perform a cyclic redundancy check procedure of each of a transmitted first plurality of code blocks until a first cyclic redundancy failure;
program code to perform the cyclic redundancy check procedure on each of a subset of a first retransmitted plurality of code blocks beginning with a retransmitted code block corresponding to the first cyclic redundancy failure until a second cyclic redundancy failure; and program code to perform a soft combine procedure on the retransmitted code block corresponding to the second cyclic redundancy check failure and a corresponding second failure code block within the first plurality of code blocks to form a second failure combined code block.

14. The non-transitory computer-readable medium of claim 13, further comprising program code to request a first retransmission at the occurrence of the first cyclic redundancy failure.

15. The non-transitory computer-readable medium of claim 13, further comprising:
program code to perform the cyclic redundancy check procedure on each of a subset of a second retransmitted plurality of code blocks beginning with a retransmitted code block corresponding to the second cyclic redundancy check failure until a third cyclic redundancy check failure; and
program code to perform the soft combine procedure on the retransmitted code block corresponding to the third cyclic redundancy check failure and a corresponding code block from the first plurality of code blocks and a corresponding code block from the first retransmitted plurality of code blocks to form a third failure combined code block.

16. The non-transitory computer-readable medium of claim 15, further comprising program code to request a second retransmission at the occurrence of the second cyclic redundancy failure.

17. The non-transitory computer-readable medium of claim 15, further comprising:
program code to perform the cyclic redundancy check procedure on each of a subset of a third retransmitted plurality of code blocks beginning with a retransmitted code block corresponding to the third cyclic redundancy check failure until a fourth cyclic redundancy check failure; and
program code to perform the soft combine procedure on the retransmitted code block corresponding to the fourth cyclic redundancy check failure and a corresponding code block from the first plurality of code blocks and corresponding code blocks from prior retransmitted plurality of code blocks to form a fourth failure combined code block.

18. The non-transitory computer-readable medium of claim 15, further comprising program code to perform the cyclic redundancy check procedure on a first remainder of the first retransmitted plurality of code blocks, wherein the first remainder of the first retransmitted plurality of code blocks begins with the second failure combined code block.

19. A non-transitory computer-readable medium having program code recorded thereon, the program code comprising:
program code to receive a first plurality of code blocks;
program code to perform a cyclic redundancy check procedure of each of the first plurality of code blocks until a first cyclic redundancy failure;
program code to request a first retransmission of the first plurality of code blocks;
program code to receive a first retransmitted plurality of code blocks;
program code to perform the cyclic redundancy check procedure on each of a subset of the first retransmitted plurality of code blocks beginning with a retransmitted code block corresponding to the first cyclic redundancy failure until a second cyclic redundancy failure; and
program code to perform a soft combine procedure on the retransmitted code block corresponding to the second cyclic redundancy check failure and a corresponding second failure code block within the first plurality of code blocks to form a second failure combined code block.

20. The non-transitory computer-readable medium of claim 19, further comprising:
program code to request a second retransmission of the plurality of code blocks;
program code to receive a second retransmitted plurality of code blocks;
program code to perform the cyclic redundancy check procedure on each of a subset of the second retransmitted plurality of code blocks beginning with a retransmitted code block corresponding to the second cyclic redundancy check failure until a third cyclic redundancy check failure; and
program code to perform the soft combine procedure on the retransmitted code block corresponding to the third cyclic redundancy check failure and a corresponding code block from the first plurality of code blocks and a corresponding code block from the first retransmitted plurality of code blocks to form a third failure combined code block.

21. The non-transitory computer-readable medium of claim 20, further comprising:
program code to request a third retransmission of the plurality of code blocks;
program code to receive a third retransmitted plurality of code blocks;
program code to perform the cyclic redundancy check procedure on each of a subset of the third retransmitted plurality of code blocks beginning with a retransmitted code block corresponding to the third cyclic redundancy check failure until a fourth cyclic redundancy check failure; and
program code to perform the soft combine procedure on the retransmitted code block corresponding to the fourth cyclic redundancy check failure and a corresponding code block from the first plurality of code blocks and corresponding code blocks from prior retransmitted plurality of code blocks to form a fourth failure combined code block.

22. The non-transitory computer-readable medium of claim 19, further comprising program code to perform the cyclic redundancy check procedure on a first remainder of the first retransmitted plurality of code blocks, wherein the first remainder of the first retransmitted plurality of code blocks begins with the second failure combined code block.

* * * * *